US007010652B2

(12) United States Patent
Piccirillo et al.

(10) Patent No.: US 7,010,652 B2
(45) Date of Patent: *Mar. 7, 2006

(54) METHOD FOR SUPPORTING MULTI-LEVEL STRIPING OF NON-HOMOGENEOUS MEMORY TO MAXIMIZE CONCURRENCY

(75) Inventors: Gary J. Piccirillo, Cypress, TX (US); John M. MacLaren, Cypress, TX (US); Robert A. Lester, Tomball, TX (US); John E. Larson, Houston, TX (US); Jerome J. Johnson, Spring, TX (US); Benjamin H. Clark, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/928,046

(22) Filed: Aug. 27, 2004

(65) Prior Publication Data

US 2005/0027951 A1 Feb. 3, 2005

Related U.S. Application Data

(62) Division of application No. 09/770,759, filed on Jan. 25, 2001, now Pat. No. 6,785,785.

(60) Provisional application No. 60/177,811, filed on Jan. 25, 2000.

(51) Int. Cl.
*G06F 12/00* (2006.01)

(52) U.S. Cl. .......................... 711/157; 711/114; 714/6; 714/764

(58) Field of Classification Search ...................... None
See application file for complete search history.

(56) References Cited

U.S. PATENT DOCUMENTS

| | | | |
|---|---|---|---|
| 5,313,626 A | 5/1994 | Jones et al. | 395/575 |
| 5,331,646 A | 7/1994 | Krueger et al. | 371/40.1 |
| 5,367,669 A | 11/1994 | Holland et al. | 395/575 |
| 5,463,643 A | 10/1995 | Gaskins et al. | 714/43 |
| 5,761,695 A | 6/1998 | Maeda et al. | 711/118 |
| 5,787,459 A | 7/1998 | Stallmo et al. | 711/114 |
| 5,845,319 A | 12/1998 | Yorimitsu | 711/114 |
| 6,052,759 A | 4/2000 | Stallmo et al. | 711/114 |
| 6,098,132 A | 8/2000 | Olarig et al. | 710/103 |
| 6,223,301 B1 | 4/2001 | Santeler et al. | 714/6 |
| 6,233,665 B1 | 5/2001 | Bolyn | 711/118 |

OTHER PUBLICATIONS

Rambus, "Direct Rambus Technology Disclosure" Oct. 1997 p. 4-5.
"PCTechGuide: Components/System Memory", Mar. 2002, http://www.pctechguide.com/03mem2.htm.
"Direct RDRAM 128/144-Mbit (256Kx16/18x32s)" http://www.rambus.com/products/rdram/documentation/adddocs.cfm May 1, 1999.

*Primary Examiner*—Mano Padmanabhan
*Assistant Examiner*—Paul Baker

(57) ABSTRACT

A computer system includes a plurality of memory modules that contain semiconductor memory, such as DIMMs. The system includes a host/data controller that utilizes an XOR engine to store data and parity information in a striped fashion on the plurality of memory modules to create a redundant array of industry standard DIMMs (RAID). The host/data controller also interleaves data on a plurality of channels associated with each of the plurality of memory modules.

12 Claims, 7 Drawing Sheets

METHOD FOR SUPPORTING MULTI-LEVEL STRIPING OF NON-HOMOGENEOUS MEMORY TO MAXIMIZE CONCURRENCY

CROSS-REFERENCE TO RELATED APPLICATIONS

This application is a divisional of application Ser. No. 09/770,359, filed on Jan. 25, 2001, now U.S. Pat. No. 6,785,785, which is a non-provisional application which claims priority to Provisional Application Ser. No. 60/177,811, filed on Jan. 25, 2000.

The following commonly owned applications and patents are hereby incorporated by reference for all purposes:

U.S. patent application Ser. No. 08/940,419, filed Sep. 30, 1997, entitled "Installation and Removal of Components of a Computer" by Sompong P. Olarig, Kenneth A. Jansen, and Paul A. Santler, issued Aug. 1, 2000, as U.S. Pat. No. 6,098,132;

U.S. patent application Ser. No. 08/940,282, filed Sep. 30, 1997, entitled "Fault Tolerant Memory" by Paul A. Santler, Kenneth A. Jansen, and Sompong P. Olarig.

U.S. patent application Ser. No. 09/303,369, filed Apr. 30, 1999, entitled "Replacement, Upgrade and/or Additional of Hot-Pluggable Components in a Computer System" by Theodore F. Emerson, Vincent Nguyen, Peter Michels, and Steve Clohset; and U.S. Patent Application Ser. No. 60177,989, filed concurrently herewith, entitled "Memory Sub-System Error Cleansing" by William J. Walker, and John M. MacLaren;

U.S. Patent Application Ser. No. 60177,810, filed concurrently herewith, entitled "Hot Replace Power Control Sequence Logic" by John M. MacLaren, Jerome J. Johnson, Robert A. Lester, Gary J. Piccirillo, John E. Larson, and Christian H. Post;

U.S. Patent Application Ser. No. 60177,952, filed concurrently herewith, entitled "Hot-Replace of Memory" by John E. Larson, John M. MacLaren, Jerome J. Johnson, Gary J. Piccirillo, Robert A. Lester, Christian H. Post, Jefferey Galloway, Anisha Anand, Ho M. Lai, and Eric Rose;

U.S. Patent Application Ser. No. 60177,812, filed concurrently herewith, entitled "Hot-Upgrade/Hot-Add Memory" by Jerome J. Johnson, John M. MacLaren, Robert A. Lester, John E. Larson, Gary J. Piccirillo, Christian H. Post, Jeffery Galloway, Ho M. Lai, Anisha Anand, and Eric Rose U.S. Patent Application Ser. No. 60177,801, filed concurrently herewith, entitled "Raid Memory" by John M. MacLaren, Paul Santeler, Kenneth A. Jansen, Sompong P. Olarig, Robert A. Lester, Patrick L. Ferguson, John E. Larson, Jerome J. Johnson, and Gary J. Piccirillo;

U.S. Patent Application Ser. No. 10764,932, filed concurrently herewith, entitled "Technique for Identifying Multiple Circuit Components" by John M. MacLaren and John E. Larson;

U.S. patent application Ser. No. 09769,958, filed concurrently herewith, entitled "Memory Data Verify Operation" by Robert A. Lester, John M. MacLaren, Patrick L. Ferguson, and John E. Larson;

U.S. patent application Ser. No. 09769,959, filed concurrently herewith, entitled "Real-Time Hardware Memory Scrubbing" by John E. Larson, John M. MacLaren, Robert A. Lester, Gary Piccirillo, Jerome J. Johnson, and Patrick L. Ferguson;

U.S. patent application Ser. No. 09/770,101, filed concurrently herewith, entitled "Hot-Plug Memory Cartridge Power Control Logic" by Ho M. Lai and John M. MacLaren;

U.S. patent application Ser. No. 09770,100, filed concurrently herewith, entitled "Removable Memory Cartridge System for Use With a Server or Other Processor-Based Device" by Brett D. Roscoe, George D. Megason, and Christian H. Post;

BACKGROUND OF THE INVENTION

1. Field of the Invention

This invention relates generally to memory systems and, more particularly, to redundant memory systems.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

As most people know, the use of computers has increased dramatically over the past few decades. In the early days, computers were relatively few in number and primarily used as scientific tools. However, with the advent of standardized architectures and operating systems, computers soon became virtually indispensable tools for a wide variety of businesses. Perhaps even more significantly, in the past ten to fifteen years with the advent of relatively simple user interfaces and ever increasing processing capabilities, computers have now found their way into many homes. Today, at least one full generation has been raised in a world which, from their perspective, has always known computers, thus making computers a familiar and integral part of many lives.

The types of computing systems have similarly evolved over this period of time. For example, early scientific computers were typically stand-alone systems designed to carry out relatively specific tasks and requiring relatively knowledgeable users. As computer systems evolved into the business arena, mainframe computers emerged. In mainframe systems, users utilized "dumb" terminals to provide input to and to receive output from the mainframe computer, while all processing was done centrally by the mainframe computer. As users desired more autonomy in their choice of computing services, personal computers evolved to provide processing capability on each user's desktop. More recently, personal computers have given rise to relatively powerful computers called servers. Servers are typically multiprocessor computers that couple numerous personal computers together in a network. In addition, these powerful servers are also finding applications in various other capacities, such as in the communications and Internet industries.

Computers today, such as the personal computers and servers mentioned above, rely on microprocessors, associated chip sets, and memory chips to perform most of their processing functions. Because these devices are integrated circuits formed on semiconducting substrates, the technological improvements of these devices have essentially kept pace with one another over the years. In contrast to the dramatic improvements of the processing portions of a computer system, the mass storage portion of a computer system has experienced only modest growth in speed and reliability. As a result, computer systems failed to capitalize fully on the increased speed of the improving processing systems due to the dramatically inferior capabilities of the mass data storage devices coupled to the systems.

While the speed of these mass storage devices, such as magnetic disk drives, has not improved much in recent years, the size of such disk drives has become smaller while maintaining the same or greater storage capacity. Furthermore, such disk drives have become less expensive. To capitalize on these benefits, it was recognized that a high capacity data storage system could be realized by organizing multiple small disk drives into an array of drives. However, it was further recognized that large numbers of smaller disk drives dramatically increased the chance of a disk drive failure which, in turn, increases the risk of data loss. Accordingly, this problem has been addressed by including redundancy in the disk drive arrays so that data lost on any failed disk drive can be reconstructed through the redundant information stored on the other disk drives. This technology has been commonly referred to as "redundant arrays of inexpensive disks" (RAID).

To date, at least five different levels of RAID have been introduced. The first RAID level utilized mirrored devices. In other words, data was written identically to at least two disks. Thus, if one disk failed, the data could be retrieved from one of the other disks. Of course, a level 1 RAID system requires the cost of an additional disk without increasing overall memory capacity in exchange for decreased likelihood of data loss. The second level of RAID introduced an error code correction (ECC) scheme where additional check disks were provided to detect single errors, identify the failed disk, and correct the disk with the error. The third level RAID system utilizes disk drives that can detect their own errors, thus eliminating the many check disks of level 2 RAID. The fourth level of RAID provides for independent reads and writes to each disk which allows parallel input-output operations. Finally, a level 5 RAID system provides memory striping where data and parity information are distributed in some form throughout the disk drives in the array.

The implementation of data redundancy, such as in the RAID schemes discussed above, creates fault tolerant computer systems where the system may still operate without data loss even if one drive fails. This is contrasted to a disk drive array in a non-fault tolerant system where the entire system is considered to have failed if any one of the drives fail. Of course, it should be appreciated that each RAID scheme necessarily trades some overall storage capacity and additional expense in favor of fault tolerant capability. Thus, RAID systems are primarily found in computers performing relatively critical functions where failures are not easily tolerated. Such functions may include, for example, a network server, a web server, a communication server, etc.

One of the primary advantages of a fault tolerant mass data storage system is that it permits the system to operate even in the presence of errors that would otherwise cause the system to malfunction. As discussed previously, this is particularly important in critical systems where downtime may cause relatively major economic repercussions. However, it should be understood that a RAID system merely permits the computer system to function even though one of the drives is malfunctioning. It does not necessarily permit the computer system to be repaired or upgraded without powering down the system. To address this problem, various schemes have been developed, some related to RAID and some not, which facilitate the removal and/or installation of computer components, such as a faulty disk drive, without powering down the computer system. Such schemes are typically referred to as "hot plug" schemes since the devices may be unplugged from and/or plugged into the system while it is "hot" or operating.

Although hot plug schemes have been developed for many computer components, including microprocessors, memory chips, and disk drives, most such schemes do not permit the removal and replacement of a faulty device without downgrading system performance to some extent. Furthermore, because memory chips have been traditionally more reliable than disk drives, error detection and correction schemes for memory chips have generally lagged behind the schemes used for disk drives.

However, certain factors may suggest that the reliability of semiconductor memory systems may also require improvement. For instance, in the near future, it is believed that it will be desirable for approximately 50% of business applications to run continuously 24 hours a day, 365 days a years. Furthermore, in 1998, it was reported that the average cost of a minute of downtime for a mission-critical application was $10,000.00. In addition to the increasing criticality of such computer systems and the high cost of downtime of such systems, the amount of semiconductor memory capacity of such systems has been increasing steadily and is expected to continue to increase. Although semiconductor memories are less likely to fail than disk drives, semiconductor memories also suffer from a variety of memory errors. Specifically, "soft" errors account for the vast majority of memory errors in a semiconductor memory. Such soft errors include cosmic rays and transient events, for instance, that tend to alter the data stored in the memory. Most soft errors are single bit errors that are correctable using standard ECC technology. However, some percentage of these errors are multi-bit errors that are uncorrectable by current ECC technology. Furthermore, the occurrence of soft errors increases linearly with memory capacity. Therefore, as memory capacities continue to increase, the number of soft errors will similarly increase, thus leading to an increased likelihood that the system will fail due to a soft error. Semiconductor memories may also suffer from "hard" errors. Such hard errors may be caused by over voltage conditions which destroy a portion of the memory structure, bad solder joints, malfunctioning sense amplifiers, etc. While semiconductor memories are typically subjected to rigorous performance and burn-in testing prior to shipment, a certain percentage of these memories will still malfunction after being integrated into a computer system. Again, as the number of memory chips and the memory capacities of computer systems increase, a likelihood of a semiconductor memory developing a hard error also increases.

System performance of a server depends strongly on the memory's bandwidth and latency. Traditionally, memory latency is quoted using two measures: access time and cycle time. Access time is the time between when a read is requested and when the desired data arrives. The cycle time is the minimum time between requests to memory.

In the past, DRAM or SDRAM have been the only choices for main memory. However, in the near future, there will be more choices from which customers may choose. Therefore, it may be desirable for the future computer servers to be able to support several types of memory devices. Currently, most memory controllers cannot support different memory types, sizes and speeds.

The present invention may be directed to one or more of the problems set forth above.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
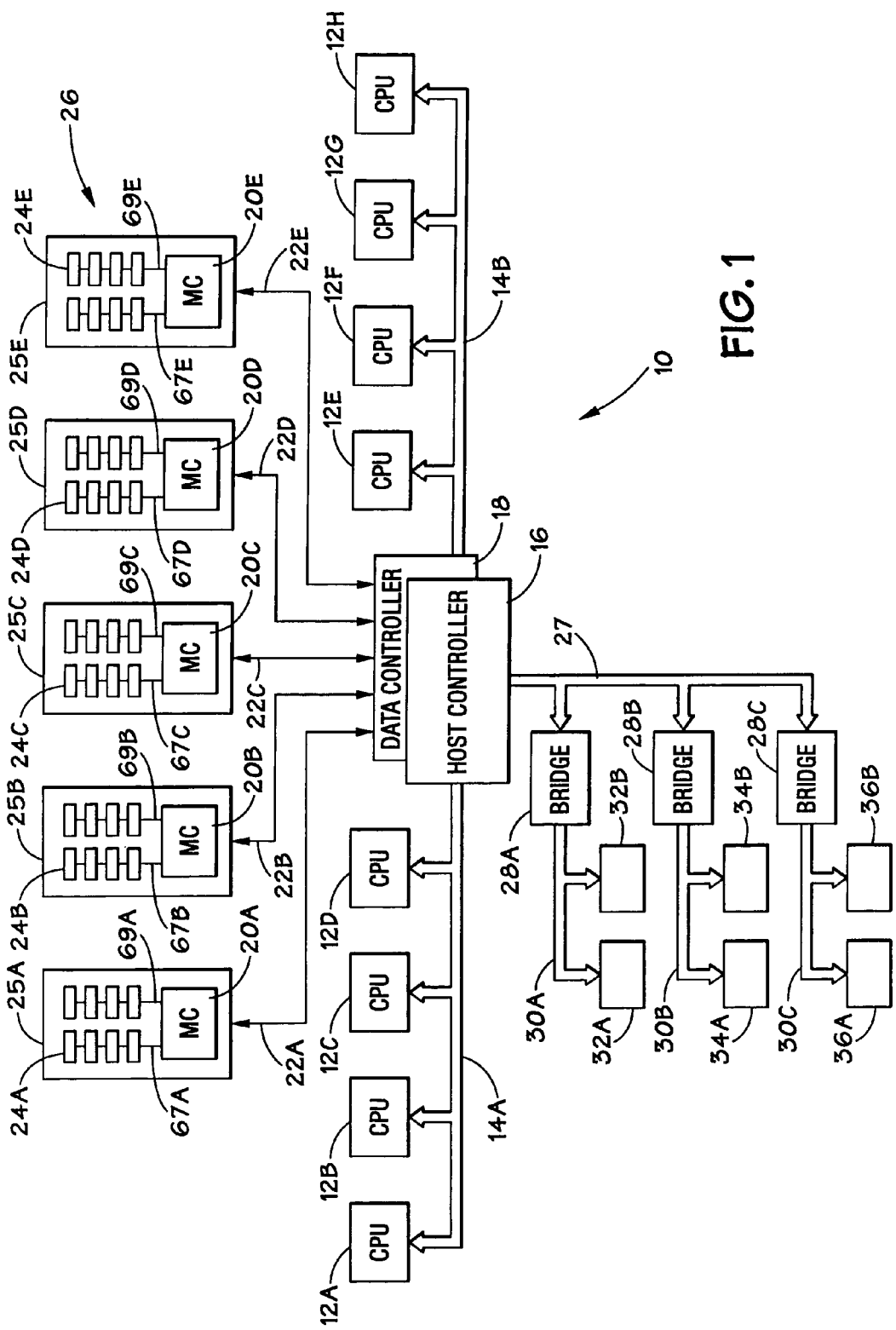
FIG. 1 is a block diagram illustrating an exemplary computer system in accordance with the present invention.

Turning now to the drawings and referring initially to FIG. 1, a block diagram of an exemplary computer system is illustrated and designated using a reference numeral 10. The computer system 10 typically includes one or more processors or CPUs. In the exemplary embodiment, the system 10 utilizes eight microprocessors 12A–12H. The system 10 utilizes a split bus configuration in which the processors 12A–12D are coupled to a bus 14A, whereas the processors 12E–12H are coupled to a bus 14B. It should be understood that the processor or processors 12 may be of any suitable type, such as a microprocessor available from Intel, AMD, or Motorola, for example. Furthermore, any suitable bus arrangement may be coupled to the processors 12, such as a single bus, a split bus (as illustrated), or individual buses. By way of example, the exemplary system 10 may utilize Intel Pentium III processors and the buses 14A and 14B may operate at 100/133 MHz.

Each of the buses 14A and 14B is coupled to a chip set which includes a host controller 16 and a data controller 18. In this embodiment, the data controller 18 is effectively a data cross bar slave device controlled by the host controller 16. Therefore, these chips will be referred to together as the host/data controller 16,18. The host/data controller 16,18 is further coupled to one or more memory controllers. In this particular example, the host/data controller 16,18 is coupled to five memory controllers 20A–20E via five individual bus segments 22A–22E, respectively. As will be appreciated from a study of the remainder of this disclosure, these individual bus segments 22A–22E (also referred to herein as MNET) facilitate the removal of individual memory modules. Each of the memory controllers 20A–20E is further coupled to a segment of main memory designated as 24A–24E, respectively. As discussed in detail below, each of the memory segments or modules 24A–24E is typically comprised of dual inline memory modules (DIMMs).

As will be appreciated from the discussion herein, the number of memory segments 24 may vary depending upon the type of memory system desired. In general, redundant memory systems will utilize two or more memory segments 24. Although the five memory segments 24A–24E illustrated in the exemplary embodiment facilitates a "4+1" striping pattern of data and parity information as discussed in detail below, a memory system having two memory segments 24 may be used in which data is mirrored on each segment to provide redundancy. Similarly, a memory system having three or more memory segments may be used to provide various combinations of data and parity striping.

The host/data controller 16,18 is typically coupled to one or more bridges 28A–28C via a suitable bus 27. The opposite side of each bridge 28A–28C is coupled to a respective bus 30A–30C, and a plurality of peripheral devices 32A and B, 34A and B, and 36A and B may be coupled to the respective buses 30A, 30B, and 30C. The bridges 28A–28C may be any of a variety of suitable types, such as PCI, PCI-X, EISA, AGP, etc.

Each of the memory controllers 20A–20E and its associated main memory segment 24A–24E forms a portion of the main memory array 26. The five memory controllers 20A–20E operate in lock-step. In this example, each of the memory controllers 20A–20E handle a separate quad-word of each cacheline of data (assuming a 32 byte cacheline) that is being transferred to or from the host and data controllers 16 and 18. For example, the memory controller 20A handles the first quad-word of every data read and write transaction, the memory controller 20B handles the second quad-word, the memory controller 20C handles the third quad-word, and the memory controller 20D handles the fourth quad-word. Instead of receiving one of the four quad-words, the memory controller 20E handles data parity for the four quad-words handled by the memory controllers 20A–20D. Thus, as described below, the memory array 26 forms a "redundant array of industry standard DIMMs" (RAID) memory structure.

As will be explained in greater detail below, during a data read operation, the host/data controller 16,18 receives four quad-words of data plus parity from the five memory controllers 20A–20E, validates data integrity of each quad-word and parity using ECC codes, and, if necessary, corrects bad data using an exclusive OR (XOR) engine before forwarding the data to its destination. During a data write operation, the host/data controller 16,18 uses the XOR engine to calculate data parity and transfers the four quad-words of data and parity to the five respective memory controllers 20A–20E. In this embodiment, all data transfers between the host/data controller 16,18 and the five memory controllers 20A–20E are an entire cacheline, and partial writes are translated into read-modify-write operations.

Furthermore, as also described in greater detail below, the five MNET bus segments 22A–22E provide electrical isolation to each of the respective five memory controllers 20A–20E to facilitate hot-plug removal and/or replacement of each of the five memory segments 24A–24E. The RAID functionality described herein allows any one of the five memory segments 24A–24E to be removed while the system 10 continues to operate normally, albeit not in a redundant mode. Once the removed memory segment is reinstalled, the data is rebuilt from the other four memory segments, and the memory system resumes operation in its redundant, or fault-tolerant, mode.

In this embodiment, each of the memory segments 24A–24E may include one to eight dual inline memory modules (DIMMs). Typically, such DIMMs are organized in an X4 or an X8 fashion. In other words, the memory chips on the DIMM are either 4 bits wide or 8 bits wide. To produce a 72 bit quad-word using an X4 memory organization, an exemplary DIMM may include nine 4 bit wide memory chips located on one side of the DIMM and nine 4 bit wide memory chips located on the opposite side of the DIMM. Conversely, to produce a 72 bit quad-word using an X8 memory organization, an exemplary DIMM may include nine 8 bit wide memory chips located on a single side of the DIMM. As discussed below, X8 memory organization may defeat the ECC capability to detect a failure in a single device. Therefore, an X4 memory organization may provide a slightly more reliable memory. The memory chips on each DIMM are typically selected from one or more DRAM technologies, such as synchronous DRAM, double data rate SDRAM, direct-RAM BUS, and synclink DRAM.

Figure 2:
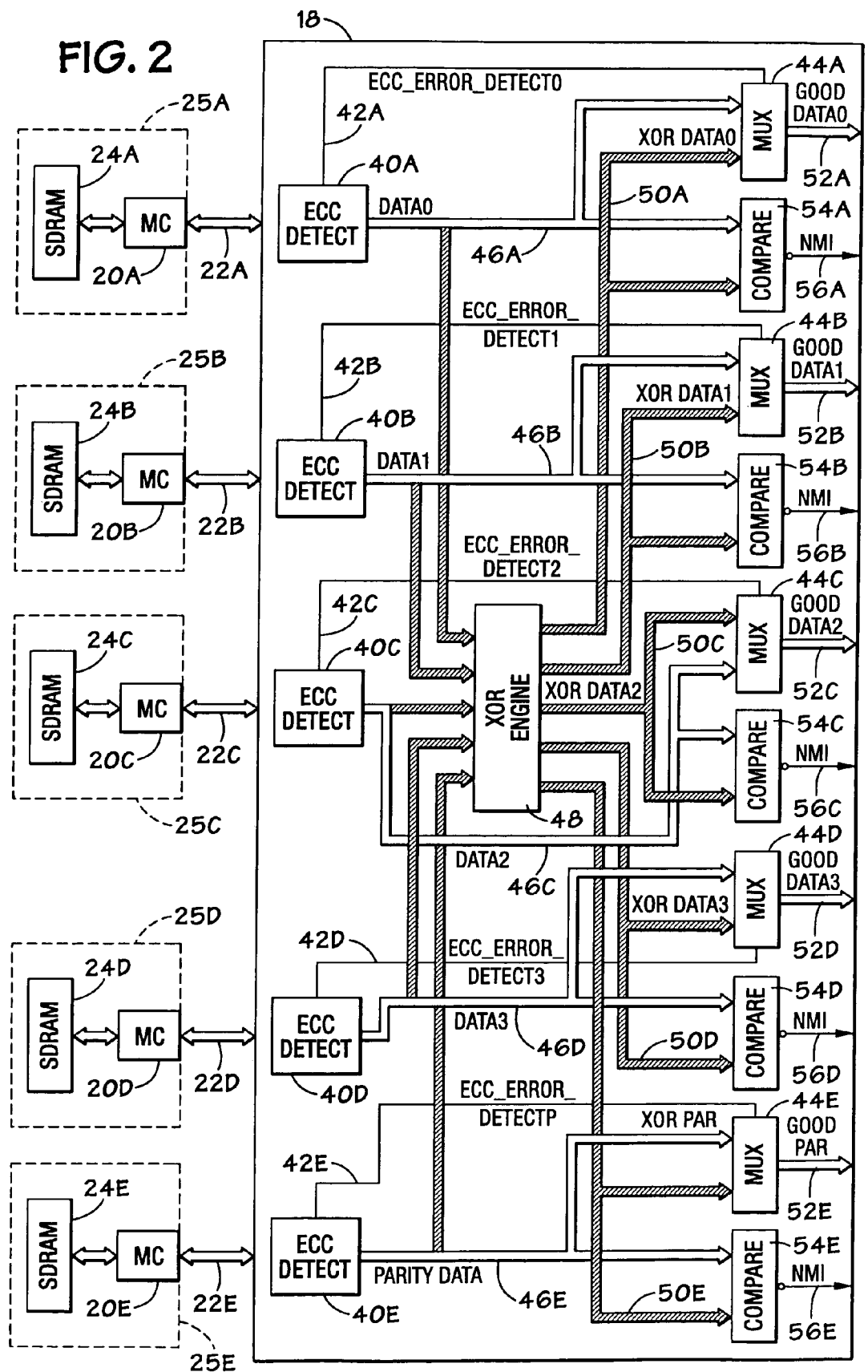
FIG. 2 is a block diagram generally illustrating one implementation of a RAID architecture in accordance with the present invention.

The manner in which the exemplary "4+1" RAID architecture functions will now be explained with reference to FIG. 2. During a memory read operation, a quad-word from each of the first four memory segments 24A–24D and parity from the one remaining memory segment 24E are transmitted to the respective memory controllers 20A–20E. When operating in X4 memory mode, each of the memory controllers 20A–20E uses an ECC algorithm (such as a P6 ECC algorithm) to detect single bit memory errors and a single bit error correction algorithm to correct any single bit errors detected by the ECC algorithm. When operating in X8 memory mode, each of the memory controllers 20A–20E uses an ECC algorithm to detect single bit errors, but such errors are not corrected by the memory controllers 20A–20E.

Indeed, it should be appreciated that parity information can detect a single bit error, but it cannot even detect, much less correct, double bit errors, multi-bit errors in a nibble or a byte, or any other type of error. Standard ECC algorithms, on the other hand, are more capable. ECC can detect and correct single bit errors, and can detect double bit errors and multi-bit errors in a nibble. ECC cannot detect multiple errors in both nibbles of a byte. However, as will be appreciated from the discussion herein, the RAID architecture can detect and correct single bit errors, double bit errors, multi-bit errors in a nibble, and multi-bit errors in a byte, as well as detect errors in other situations.

Once the memory controllers 20A–20E have processed the data as discussed above, the data is transferred via the respective buses 22A–22E to the host/data controller 16,18. The host/data controller 16,18 includes ECC modules 40A–40E to detect multi-bit errors in each of the four quad-words and the parity information delivered from the respective memory controllers 20A–20E. The outputs 42A–42E of each of the ECC modules 40A–40E are coupled to a respective multiplexer 44A–44E. Based on the output 42A–42E of each of the ECC modules 40A–40E, each respective multiplexer 44A–44E selects between the original data delivered to the multiplexers 44A–44E on respective buses 46A–46E and the re-created data generated by the exclusive OR (XOR) engine 48 delivered to the multiplexers 44A–44E via the respective buses 50A–50E. Specifically, if one of the ECC modules 40A–40E detects a multi-bit error, the ECC module 40A–40E switches its respective multiplexer 44A–44E such that the bad data on the respective bus 46A–46E is replaced by the good re-created data available on the respective bus 50A–50E. Thus, when operating in X4 memory mode, the XOR engine 48 is used to correct multi-bit errors only, while when operating in X8 memory mode, the XOR engine 48 corrects 20 both single bit errors and multi-bit errors.

A few aspects of this type of RAID functionality should be understood. First, when operating in X4 memory mode, each memory segment 24A–24E may exhibit a single bit error which may be corrected without even triggering the use of the re-created data generated by the XOR engine 48. However, only a single multi-bit error on one of the memory segments 24A–24E can be corrected per each memory transaction using the XOR engine 48. Conversely, when operating in X8 memory mode, the host/data controller 16,18 can correct only one single bit error or multi-bit error in one of the memory segments 24A–24E. Thus, if more than one of the memory segments 24A–24E exhibits a single bit error or a multi-bit error in X8 memory mode, or if more than one of the memory segments 24A–24E exhibits a multi-bit error in X4 memory mode, the XOR engine 48 will be unable to create good data to be transmitted out of the host/data controller 16,18 on the buses 52A–52E. In these circumstances, the comparator circuits 54A–54E, which receive the data on the respective bus errors 46A–46E and 50A–50E, deliver a non-maskable interrupt (NMI) on the respective lines 56A–56E. The NMI is typically delivered to the requesting device to indicate that a memory error has occurred and that the requested data cannot be delivered.

The memory segments may be organized on a single channel or on 2N channels, where N is an integer. In this particular embodiment, each of the memory segments 24A–24E is divided into two channels—a first channel 67A–67E and a second channel 69A–69E, respectively. Since each memory segment 24A–24E in this embodiment is capable of containing up to eight DIMMs, each channel is adapted to access up to four of the eight DIMMs. Because this embodiment includes two channels, each of the memory controllers 20A–20E essentially includes two independent memory controllers.

Figure 3:
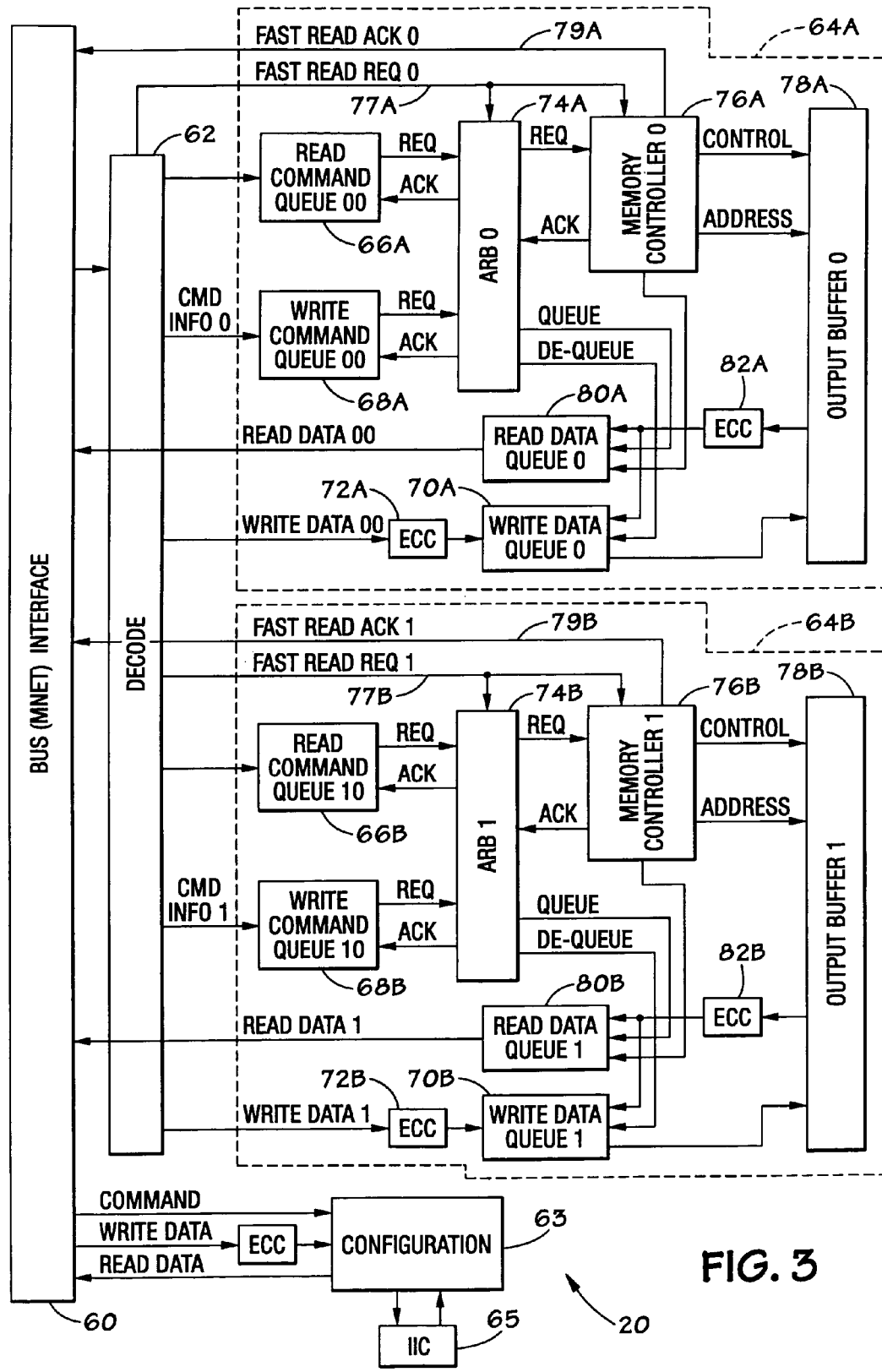
FIG. 3 is a block diagram illustrating an exemplary memory controller in accordance with the present invention.

A block diagram of an exemplary memory controller 20 is illustrated in FIG. 3. The memory controller 20 includes a bus interface 60 that is coupled to the respective bus segment 22A–22E to enable the memory controller to pass data to and from the bus 22. In this example, the bus interface 60 communicates between the bus 22, which is operating at 400 MHz, and internal decode logic 62, which is operating at 100 or 133 MHz. One primary function of the bus interface 60 is to meet the protocol and timing requirements of the MNET bus 22 for receiving write data and commands and for transmitting read data and status.

The decode logic 62 decodes the destination of read and write transaction according to the commands from the bus 22, as well as the internal set of configuration registers 63. In the case of memory transactions, the decode logic 62 generates the bank address, chip-select signals, and row and column addresses. Commands, write data, and read data may be transferred between the decode logic 62 and the configuration registers 63 for a variety of reasons. For example, the configuration registers 63 may be used to store different CAS latencies, parameters the dictate memory controller operation, log information, ID information, and error capturing logic. The configuration registers 63 are coupled to an IIC bus 65 to permit communication with the DIMMs.

The decoded information from the decode logic 62 is then delivered to one of two identical memory controller circuits 64A and 64B, each of which controls a respective first channel 67 and a respective second channel 69. As discussed in greater detail with respect to FIG. 7, the memory controller circuit 64A generally handles the even cachelines for the first channel 67, while the memory controller circuit 64B generally handles the odd cachelines for the second channel 69. Read and write command information from the decode logic 62 is delivered, respectively, to the read command queues 66A and 66B and the write command queues 68A and 68B. Write data is delivered from the decode logic 62 to respective write data queues 70A and 70B. In this embodiment, each of the write data paths includes a respective ECC module 72A and 72B that is designed to detect and correct single bit errors in the write data before it reaches the respective write data queues 70A and 70B.

The read command and write command information from the queues 66A and 66B, 68A and 68B is delivered to a respective arbitration logic circuit 74A and 74B. The arbitration logic 74A and 74B controls transaction timing to the memory modules, and is typically employed to maximize bus bandwidth. The arbitration logic 74A and 74B delivers a request signal to a respective memory controller 76A and 76B which provides control and address information to a respective output buffer 78A and 78B. The arbitration logic 74A and 74B, in conjunction with the respective memory controller 76A and 76B also queues and/or dequeues write data stored in the write data queues 70A and 70B. It should also be noted that this embodiment includes fast read request lines 77A and 77B and fast read acknowledgement lines 79A and 79B. The fast read request lines 77A and 77B deliver a fast read request from the decode logic 62 to the respective memory controller 76A and 76B to request a read operation that bypasses the read command queue 66A and 66B—an operation that is permitted to reduce latency and improve timing during certain situations where the read command queue is empty. If the operation is permitted, an acknowledgement is transmitted from the respective memory controller 76A and 76B to the bus interface 60 on the fast read acknowledgement lines 79A and 79B.

During a read transaction, the data received from the DIMMs is transferred to a respective read data queue 80A and 80B. As with the write data, the read data may also be passed through a respective ECC circuit 82A and 82B to detect and optionally correct any single bit errors prior to the data reaching the respective read data queue 80A and 80B. The arbitration logic 74A and 74B, in conjunction with the memory controllers 76A and 76B, also controls the queuing and dequeuing of data in the read data queues 80A and 80B. Read data is delivered from the read data queues 80A and 80B to the bus interface 60 for transmission on the bus 22.

Figure 4:
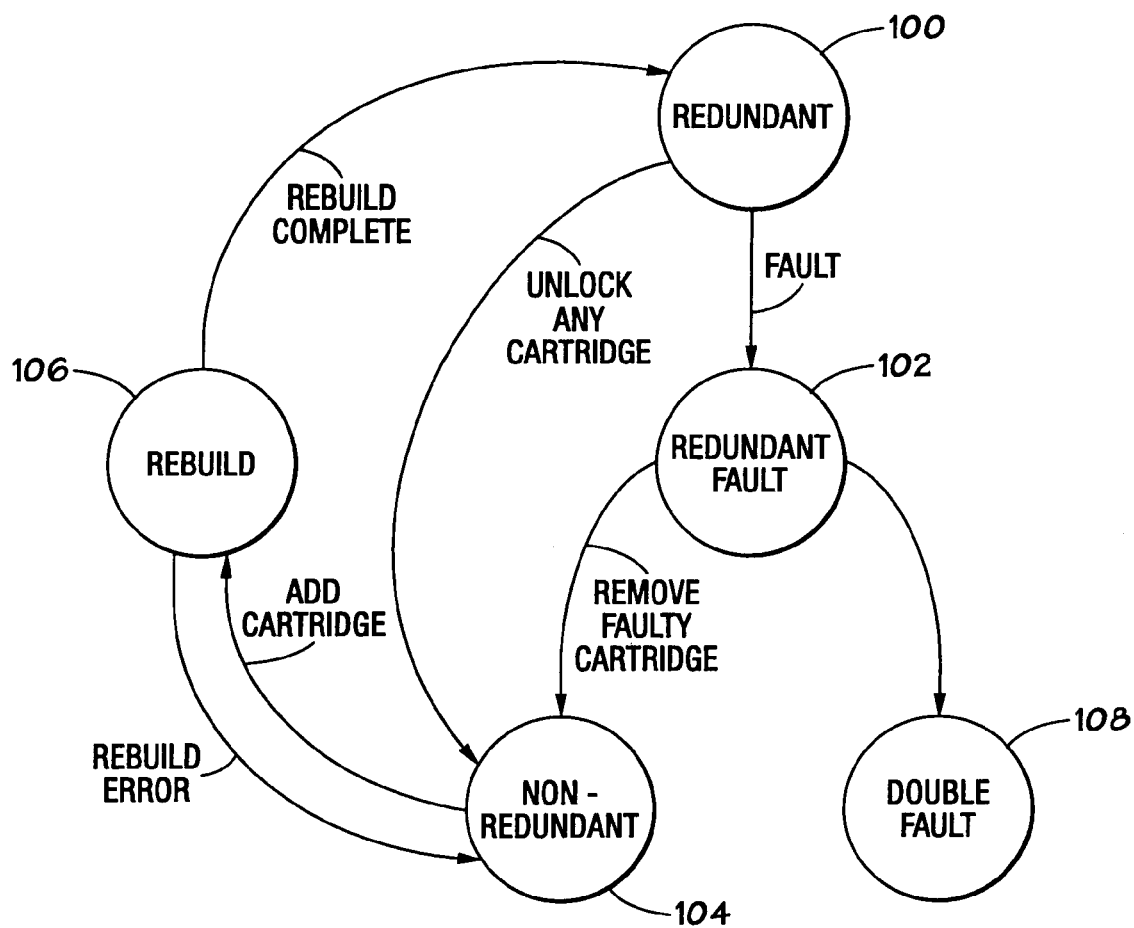
FIG. 4 is a state diagram illustrating the various states for a memory array in accordance with the present invention.

The manner in which the memory array 26 operates in a redundant, i.e., RAID, mode has been described above. One benefit of such functionality is the ability to remove, replace, upgrade, or add DIMMs to a selected memory segment 24A–24E while the system 10 remains operational. Such capability may be referred to as "hot-plugging." As described below, the memory segments 24A–24E may be configured as separate memory cartridges 25A–25E to facilitate hot-plugging operations. The memory controllers 20A–20E may be part of the cartridges or separate from them. When the system 10 is provided with this capability, the memory array 26 will operate in one of several different modes: redundant, non-redundant, rebuilding, or failed. The state of the memory array 26 may directly impact what operations can be performed without jeopardizing the integrity of the system 10. The state diagram illustrated in FIG. 4 shows the various states and state transitions for the memory array 26.

When all of the memory modules are operating in an error free mode, the memory array 26 is operating in the redundant state 100. If a user unlocks a memory cartridge 25 (to upgrade or add to the memory for example), the memory array 26 will transition from the redundant state 100 to the non-redundant state 104. If a single bit or a multi-bit error is detected in one of the memory segments 24A–24E, the memory array 26 switches states, and it begins operating in a redundant-fault state 102. If the ECC and/or XOR engine 48 is able to clear the error condition and provide good data, the memory array 26 switches back to the redundant state 100. Such a transition from the redundant-fault state 102 to the redundant state 100 may take place, for instance, due to a non-reoccurring soft error. However, if soft errors reoccur frequently, the memory array 26 may continue to operate in the redundant-fault state 102 for a certain period of time.

If soft errors occur too frequently, if a hard error occurs, or if a user unlocks a memory cartridge (to replace the faulty memory device for instance), the memory array 26 transitions into a non-redundant state 104. In the non-redundant state 104, the system 10 will typically provide one or more messages to alert a user or system administrator that a memory fault has occurred, for example, and that the system 10 is operating in a non-redundant state. Of course, in the non-redundant state 104, one of the memory segments 24A–24E is essentially disabled so that data that would normally be stored on the disabled segment is not accessed, but instead re-created using the XOR engine 48. As discussed previously, the memory array 26 may continue to operate in the non-redundant state 104 for an extended period of time and provide good data. Of course, if another fault occurs in one of the other memory segments while the memory array 26 is operating in the non-redundant state 104, data could be corrupted.

Typically, a user or system administrator typically would not find it desirable for the memory array 26 to continue to operate in a non-redundant state for an extended period of time. Accordingly, at some point, the error-prone portion of the faulty memory segment 24A–24E would likely be replaced. Because, as discussed below, the memory array 26 provides hot-pluggable capabilities, the faulty memory module may be temporarily removed so that the memory error can be rectified, e.g., by replacing a faulty DIMM, for instance. During this hot plug replacement, the memory array 26 will continue to operate in the non-redundant state 104.

Once the faulty portion of memory has been replaced, the memory array 26 will switch into a rebuild state 106. In the rebuild state 106, the memory array 26 uses the good data from the four non-faulty memory segments 24A–24E to rebuild the data that should be stored in the fifth memory segment. Once the rebuild is completed successfully, the memory array 26 switches back to operating in the redundant state 100. However, if a rebuild error occurs, the memory array 26 will switch back to the non-redundant state 104 and provide the user and/or administrator with the appropriate warnings.

Of course, another possibility exists. If the memory array is operating in the redundant-fault mode 102 and a second memory fault occurs in one of the other four memory segments 24A–24E, the memory array 26 switches into a double fault state 108. In this state, the memory array 26 can neither operate in a redundant mode nor in a non-redundant mode because the memory array 26 cannot ensure that it is providing uncorrupted data. Accordingly, the memory array 26 will remain in the double fault mode state 108, and the user and/or administrator will be notified accordingly that two memory segments 24A–24E have exhibited errors that require correction.

Table 1, below, shows the memory array responses based on the current state of the memory array 26, the current state of the memory segments 24A–24E, and the action taken by a user. Each event may be initiated by user input, such as by the user unlocking and removing a memory cartridge.

tion of the power controller 126 is controlled by the PAL arrangement 112. The PAL arrangement 112 controls the operation of the power controller 126 based on the inputs to the PAL arrangement 112 and on the internal programming of PAL arrangement 112.

TABLE 1

Memory Array State Transition Table

| Memory Array Current State | Memory Module Current State | Event (lock, unlock) | Memory Array Next State | Memory Module Next State | Comments |
|---|---|---|---|---|---|
| Redundant | Normal | Unlock | Non-redundant | Power-down | Any memory module can be removed in redundant state |
| Redundant-fault | Normal | Unlock | Redundant-fault | Illegal | Cannot remove a normal module when another module is in the fault state. |
| Redundant-fault | Fault | Unlock | Non-redundant | Power-down | The fault memory module can be removed when the memory array is in the fault state |
| Non-redundant | Normal | Unlock | Non-redundant | Illegal | Cannot remove any memory modules when current configuration is non-redundant. |
| Non-redundant | Powerdown | Add | Rebuild | Rebuild | Initialize, rebuild, and verify new memory module. |
| Rebuild | Normal | Unlock | Rebuild | Illegal | Cannot remove any other memory modules while a module is rebuilding, system is not redundant. |
| Rebuild | Rebuild | Unlock | Non-redundant | Power-down | Can power-down the memory module that is rebuilding |
| Double fault | Normal, fault | Unlock | Double-fault | Illegal | Cannot remove any memory modules after a double fault, redundancy not guaranteed. |

Figure 5:
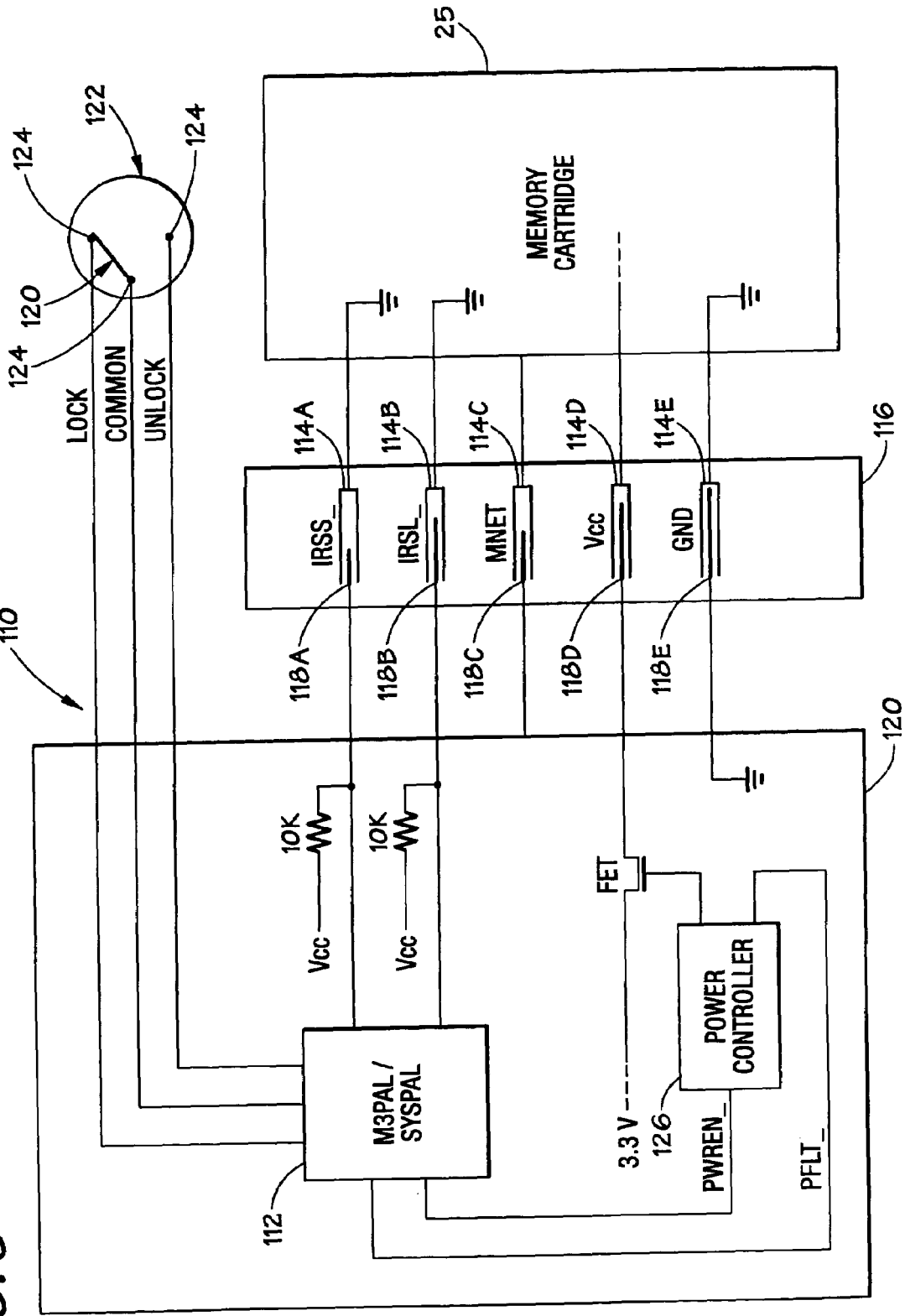
FIG. 5 illustrates a block diagram of the hot-plug interface in accordance with the present invention.

As illustrated in FIG. 5, an exemplary embodiment of the system 10 is configured so that the memory cartridges 25A–25E are hot-pluggable, i.e., the memory cartridges may be installed and removed from the system 10 without having to remove power to the system 10 or to halt the operation of the system 10. A memory hot plug interface system 110 controls the power to each memory segment 24A–24E.

In the illustrated embodiment, the memory hot plug interface 110 utilizes various inputs and programmable array logic (PAL) devices 112 to control power to each memory segment 24, illustrated as memory cartridges 25 in FIG. 5. The PAL arrangement 112 receives input from several sources. In the illustrated embodiment, female pins 114A–114E on a cartridge connector 116, which may reside on the memory cartridge 25, are configured to engage male pins 118A–118E on a memory control board 120. Each pin connection provides an electrical path to exchange data and control signals between the memory cartridge 25 and the memory control board 120. For example, an insertion/removal sensor (IRS) and a pre-insertion/removal notification sensor (PIRN) are used to provide inputs to the system.

A PIRN switch 120 may be associated with a mechanical lock 122 to provide an input based on whether the lock 122 is positioned in a LOCKED or UNLOCKED position. The PIRN switch 120 has a plurality of electrical terminals 124. The position of the lock 122 defines the electrical properties of the PIRN switch 120 between each terminal 124. The terminals 124 are used to provide an input to an audible alarm. The PIRN switch 120 may be disposed on a memory cartridge 25 to engage a portion of the memory control board 120 or on the memory control board 120 to engage a portion of the memory cartridge 25.

A power controller 126 supplies power to each memory cartridge 25 through the cartridge connector 116. The opera- The insertion/removal sensor (IRS) may utilize a pin 118A and a pin 118B to detect when a memory cartridge 25 is being installed or removed. For example, the pin 118A may be made shorter relative to the pin 118B. Additionally, the pin 118B may be made longer than the pins 118C and shorter than the pins 118D and 118E. Thus, during insertion of a memory cartridge 25, the pin 118B will come into contact with a female socket 114B before pins 118A and 118C, but after pins 118D and 118E come into contact with their respective female counterparts. Additionally, during removal of a memory cartridge 25, pin 118B will remain in contact with a female socket 114B longer than pins 118A or 118C. This information may be used by the system 10 to determine when installation or removal of a cartridge 25 has started and when it has been completed. By varying the lengths of the pins 118A–118E, the sequence of signal initialization can be controlled during a hot-plug insertion or removal event.

Figure 6:
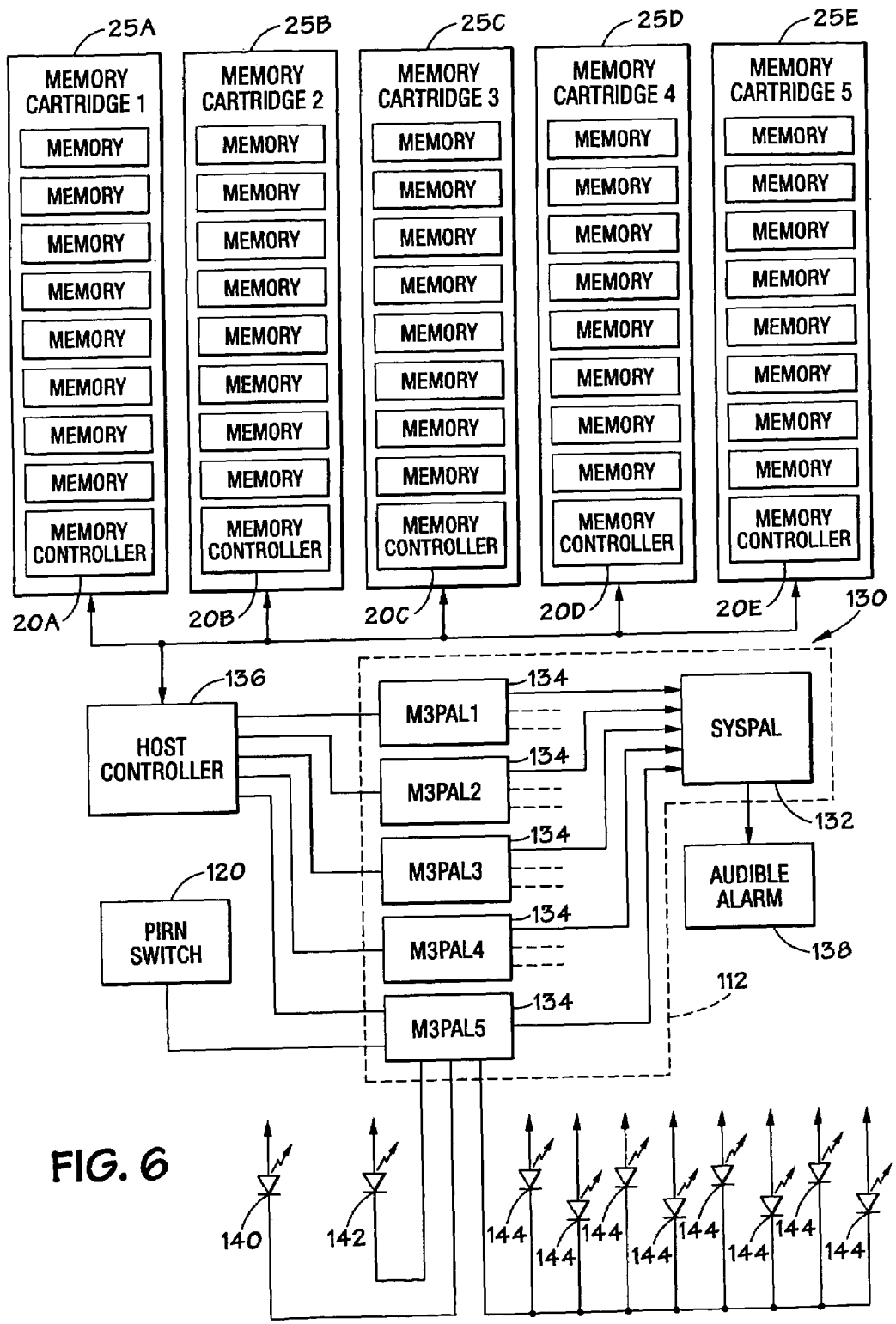
FIG. 6 illustrates a block diagram of an alarm and indication system in accordance with the present invention.

Referring generally to FIG. 6, the system 10 may also use sensors as part of an alarm and indication system 130. The alarm and indication system 130 also utilizes the PAL arrangement 112. In this embodiment, the PAL arrangement 112 utilizes one system PAL (SYSPAL) 132 and five memory cartridge specific PALs 134 (M3PAL)—one M3PAL for each memory cartridge 25. The alarm and indication system 130 utilizes the PAL arrangement 112 to identify operating conditions and to initiate an alarm and/or various indications when specific operating conditions exist.

In the illustrated embodiment, the PAL arrangement 112 receives one series of inputs through the five PIRN switches 120 (one for each memory cartridge 25A–25E). Another input is an MNET error signal provided by the host/data controller 16,18. The host/data controller 16,18 receives memory error signals from the memory controllers 20A–20E disposed within each of the five memory cartridges 25A–25E. The host/data controller 16,18 determines if the memory error signals indicate a fault condition and provides a fault condition signal to each M3PAL 134. An alarm or indication is provided when the inputs correspond to error conditions programmed into the PAL arrangement 112.

One feature of the alarm and indication system 130 is an audible alarm 138 to provide audible error condition messages to an operator. For example, the alarm and indication system 130 may respond with two long beeps if there are no valid banks of memory available to the system ROM during an initial system test. Additionally, the audible alarm 138 may sound to caution the user that an improper action has occurred, is occurring, or will occur. This enables a user to stop an improper course of action and/or reverse previous actions.

In this embodiment, various conditions may cause the memory caution alarm to emit a continuous tone. First, the alarm and indication system 130 may be configured to initiate the alarm when positioning the wrong mechanical lock 122 to an UNLOCK position. This can occur when one of the memory cartridges 25A–25E requires attention, e.g., is not online, but the wrong memory cartridge 25A–25E is unlocked. The alarm and indication system 130 may be configured so that returning the errant lock 122 to a LOCK position discontinues the alarm. Also, the alarm and indication system 130 may be configured so that positioning the cartridge lock 122 to a LOCK position during system operation while the cartridge is removed triggers the alarm.

An exemplary alarm and indication system 130 discontinues the alarm when this condition is corrected by immediately positioning the lock 122 to an UNLOCK position.

Other system indications are also provided by alarm and indication system 130. One indication is a cartridge power (CP) LED 140. In this embodiment each CP LED 140 is disposed on the memory control board 120. The light from the CP LED 140 is coupled by an optical fiber to a CP light which is visible to the user. Alternatively, the alarm and indication system 130 may energize an incandescent lamp, or some other illumination means other than an LED.

The CP LED 140 may be configured to inform the user when the cartridge 25A–25E is powered on or off, when the cartridge is undergoing a memory rebuild/verify, and/or whether the cartridge is ready to be removed. There is one CP LED 140 for each memory cartridge 25A–25E. In this embodiment, each CP LED 140 is green and has a blinking capability. Exemplary states of operation of a CP LED 140, the definition of each CP LED operating state, the conditions causing the CP LED operating state, the mechanisms that produce a change in the CP LED operating state, and the resulting CP LED state are provided in TABLE 2 below.

TABLE 2

CP LED States

| LED State | Definitions | Conditions | Mechanism | Resulting LED State |
|---|---|---|---|---|
| Off (assumes IRS connected) | Cartridge is not on-line | System off or in standby | ON/STBY switch to ON | POST: Blink green once for LED test, transitioning to blink continuous for init and verify |
| | | System on, PIRN unlocked | PIRN to LOCK | DAS: blinks continuous during rebuild and verify |
| | | Error condition exists such that the cartridge is not on-line | De-assert and assertion of IRS (user removal and insertion) | Blink green once (LED test) |
| Solid | Cartridge on-line (Normal) | System on. Cartridge locked. No cartridge errors | PIRN to UNLOCK, four other cartridges in Normal state | CP Off |
| | | | PIRN to UNLOCK, another cartridge not in Normal state | Alarm sounds CP solid green |
| | | | Cartridge Power Fault | CP Off CA solid |
| | | | Cartridge MNET Fault | CP Off CA blinking |
| | | | ON/STBY to STBY | CP Off |
| Blinking | Cartridge in power up transition | Cartridge verify or rebuild in progress | Verify or rebuild complete | CP solid green |
| | | | Error during verify | CP Off, One or more DS on |
| | | | PIRN to UNLOCK | CP Off (user aborted rebuild) |
| | | | System ON/STBY to STBY | CP Off |
| Blink once | Cartridge LED test | 1. ON/STBY to ON 2. Cartridge inserted into live system | Complete blink test | CP Off |

Another indication provided by the alarm and indication system 130 is a cartridge attention (CA) LED 142. Each CA LED 142 is optically coupled to a CA light 102 which is visible to a user to inform the user of cartridge specific conditions that require user attention, e.g., a power fault. In the illustrated embodiment, there is one CA LED 142 for each memory cartridge 25A–25E. In this embodiment, the CA LED 142 is amber in color and has the capability of blinking. Exemplary CA LED operating states, the definition of each CA LED operating state, the conditions causing the CA LED operating state, the mechanisms that produce a change in the CA LED state and the resulting CA LED state are provided in TABLE 3 below.

TABLE 3

CA LED States

| LED State | Definitions | Conditions | LED State Change | |
|---|---|---|---|---|
| | | | Mechanism | Resulting LED State |
| Off | Cartridge does not require attention. (Normal) | Normal operation | Cartridge power fault detected | CA On |
| | | | MNET error detected | CA Blinking |
| | | | PIRN to UNLOCK for cartridge that can't be hot-plugged | CA Blinking, buzzer on |
| Solid | Cartridge requires attention | Power Fault: PIRN locked, cartridge power control circuitry has detected an OC or UV condition on the cartridge | IRS de-asserted | CA Off |
| | | Cartridge is not fully inserted | IRS# asserted due to complete insertion | CA Off |
| | | | Aux5 V power lost to cartridge by cartridge removal | |
| Blinking (buzzer off) | MNET error | PIRN locked: An uncorrectable error on MNET has been detected. This channel of memory is no longer in use | System reset Power good | CA Off |
| Blinking (buzzer on) | Illegal PIRN | PIRN unlocked, buzzer on: User has illegally turned a PIRN for a cartridge that can't be hot-plugged | PIRN to LOCK | CA Off, buzzer off |
| Blink once | Cartridge LED test | ON/STBY to ON Cartridge insertion (with system on) | Complete blink test | CA Off |

Still another set of indications that may be provided by the alarm and indication system 130 are DIMM status LEDs 144. There are eight DIMM status LEDs 144 for each memory cartridge in this embodiment, one for each possible DIMM in a memory cartridge 25A–25E. Each DIMM status LED 144 is optically coupled to a DIMM status light which is visible to the user. The DIMM status (DS) LEDs 144 may inform the user whether a specific memory element is installed in a boardholder, if a memory element MNET error condition exists that requires user attention, or if a memory element bank-specific condition exists that requires user attention.

In this embodiment each DIMM status light may be amber in color. Exemplary DS LED states, the definition of each DS LED state, the conditions causing the DS LED state, the mechanisms that produce a change in the DS LED state, and the resulting DS LED state are provided in TABLE 4 below.

TABLE 4

DS LED States

| LED State | Definitions | Conditions | LED State Change | |
|---|---|---|---|---|
| | | | Mechanism | Resulting LED State |
| Off | DIMM socket not in use | DIMM socket was empty | Hot Add operation: PIRN to LOCK DIMM now present | SMI (add invalid) DS blinking |
| | | | | Driver First, legal: DS blinking, CP on First, not legal: DS blinking, CP off Not first, similar: DS blinking, CP on Not first, not similar: DS blinking, CP off |
| | DIMM in use, no errors (Normal) | DIMM socket was populated (similar to 3 or 4 other DIMMs in the same bank) | Hot Replace operation: PIRN to LOCK Existing DIMM replaced | Not similar to ROB - DS blinking Similar to ROB - DS off |
| | | | Hot Remove operation: PIRN to LOCK DIMM removed | Hot remove not supported: DS blinking |
| | | | Hot Upgrade operation: | SMI (upgrade invalid) |

TABLE 4-continued

DS LED States

| LED State | Definitions | Conditions | LED State Change Mechanism | Resulting LED State |
|---|---|---|---|---|
| | | | PIRN to LOCK Different DIMM now present | DS blinking<br><br>Driver<br>First, legal: DS blinking<br>First, not legal: DS blinking<br>Not first, similar: DS blinking<br>Not first, not similar: other DS off, this DS blinking |
| | | | DIMM ECC error detected | Hard MBE or SBE - DS on |
| Solid amber | DIMM ECC Error | A "hard" SBE or MBE was detected by chipset error logic | PIRN to LOCK (replace) | Not similar to ROB - DS blinking<br>Similar to ROB - DS off |
| Blinking amber | DIMM configuration error (POST or normal operation) | The DIMM installed in this socket is not expected<br>The DIMM in this socket is not similar with DIMMs in the rest of the bank<br>There is no DIMM installed in this socket but a DIMM is expected<br>The DIMM | PIRN to LOCK (after cartridge reinsertion) | Same as LED off, PIRN to LOCK |
| | | | System ON/STBY switch to STBY | DS off |
| Blink once | LED test | System ON/STBY switch to ON | Complete blink test | DS off |

Unique combinations of the cartridge power, cartridge attention, and DIMM status LEDs may used to identify some memory operating states. Various examples of unique LED combinations, their definitions, conditions, and LED state change mechanisms are provided in TABLE 5 below.

TABLE 5

Unique LED Combinations

| LED Combination | Definitions | Conditions | State Change Mechanism |
|---|---|---|---|
| All CP, CA, DS LEDs blink once | POST LED blink test | System ON/STBY switch to ON | Blink test complete |
| All DS LEDs in bank blinking amber continuously | Bank of memory not valid due to more than 1 problem:<br>missing DIMM + incompatible DIMM<br>2 missing DIMMs<br>2 incompatible DIMMs | POST finds problem:<br>maps out memory<br>F1 message at boot<br>ASR will reboot, no F1 | Power down to correct<br>Hot Add can correct |
| All CP LEDs blinking | POST is initializing memory | No HP activities can take place | POST initialization completes |
| 5 cartridges with:<br>All CP LEDs solid green<br>All CA LEDs off<br>All DS LEDs off | Redundant memory array | | |
| CP LED solid green<br>CA LED various<br>DS LEDs various<br>Memory alarm continuous | Cartridge UNLOCKED but not allowed to be removed | PIRN in UNLOCK<br>Memory array non-redundant | Power down to correct |
| CP LED solid green<br>CA LED off<br>DS various<br>All DS LEDs in bank off | Cartridge normal<br>DIMMs or banks may have problems<br>Bank populated and normal<br>Bank unpopulated | | |
| 4 or 5 cartridges with:<br>CP LED solid green<br>CA LED off<br>Same DS LEDs off | Memory array normal | Memory may or may not be redundant | Correct DIMM errors, bank errors to go redundant |

A number of alternative configurations of the alarm and indication system 130 are possible. For example, the alarm and indication system 130 may be configured with a set of status lights for each memory cartridge 25A–25E and a set of DIMM status LEDs, one for each memory slot, that may be shifted between memory cartridges, thus reducing the total number of indications.

During memory system operation, many events may occur, including a hot-plug power-up (occurring as a result of the insertion of a new memory cartridge), a hot-plug power-down (occurring as a result of the removal of a memory cartridge), and an auto hardware power-down (occurring as a result of an illegal unlocking of a memory cartridge). It is desirable to maintain data integrity and not to damage memory system components during any of the events. During the hot-plug power-up event and the hot-plug power-down event, there may be a preferred order of events to power-up and power-down the redundant memory cartridge, including the memory DIMMs, the memory controllers 20A–20E, the MNET bus 60, host controller/data controller bus interfaces 22A–22E, memory cartridge LEDs 140, 142, and 144 and the audible alarm 138.

As previously discussed, certain external logic is implemented during the hot-plug power-up and hot-plug power-down events. The PIRN is the pre-insertion/removal notification which is controlled by the memory cartridge lock 122. The IRS-long (IRSL_) pin 118B is a long pin on the memory cartridge connector 116 used to indicate the insertion and removal of the memory cartridge 25 from the cartridge connector 116. The IRS-short (IRSS_) pin 118A is a short pin on the memory cartridge connector 116 used to indicate the insertion and removal of the memory cartridge 25 from the cartridge connector 116. The M3PAL 134 is a PAL on the memory system board 120 use to control the power sequence logic. The Power Controller 126 is a standard power control chip used to detect under-voltage and over-current conditions.

Table 6 below illustrates one hot-plug power-up sequence which may be implemented in the present system 10. Initially, during a power-up hot-plug event, one of the memory cartridge slots is powered down. The slot may be empty or occupied. Power is initially off and the clock is disabled to the slot. The host controller (HC) 16 and host/data controller 16,18 drive all MNET signals on the particular bus segment 22A–22E to "0" on the slot. The host/data controller 16,18 drives RESET signals to "1" on the slot. The data controller (DC) 18 data ECC and XOR compare logic are disabled to the slot. The PIRN is in the unlock state.

TABLE 6

Hot-plug Power-up Sequence

| | HW | SW | Δt | Description |
|---|---|---|---|---|
| 1 | Ext. Logic | | | The M3PAL detects the IRS-long pin connection on the connector. The PAL will assert the PWRON_signal to the power controller. When the power controller sees the PWRON_signal asserted, it will turn the external FETs on to provide power to the cartridge. |
| 1 | Ext. Logic | | | The power controller senses the voltage level on the output side of the FETs. When the voltage reaches ~2.95 V, the power controller will deassert the PWRFAULT_signal. The M3PAL detects the PWRFAULT_signal deassertion and asserts the CLKEN_signal. The CLKEN_signal will enable the quick switch to connect the system clock to the cartridge. |
| 1 | HC | | $t_{SCANIN}$ | Detect a transition on the IRS-short signal indicating that a memory cartridge has been installed. |
| 2 | HC | | | Generates an interrupt indicating a new memory cartridge has been installed. |
| 3 | | SW | | Write to clear HC IRS status (HC, f0, A4-AC, bit1). |
| 3 | | SW | | Write to HC to "blink once" all memory cartridge LED's for power-on test (HC, f0, 94-9C). |
| 4 | HC | | $t_{SCANIN}$ | Detect a transition on the PIRN signal indicating that the memory cartridge is ready for power-up. |
| 5 | HC | | | Generates an interrupt indicating a new memory cartridge is ready to be powered up. |
| 5 | | SW | | Write to clear HC PIRN status (HC, f0, A4-AC, bit0). |
| 6 | | SW | | Writes to HC to turn Power LED to the blink state on the added memory cartridge (HC, f0, 94-9C, bit6–5). |
| 7 | | SW | | Writes to the HC Auto Power On configuration register (HC, f0, D2, bit4–0). |
| 8 | HC | | $t_{PU} + t_{SCANOUT}$ | Asserts a signal indicating to an external device to enable power to the memory cartridge. |
| 9 | HC | | | Load counter with Power Up Delay register value and begin count (HC, f0, E6). |
| 10 | HC | | | Wait for count to expire. |
| 11 | HC | | $t_{PLL} + t_{SCANOUT}$ | Asserts a signal indicating to an external device to enable the system clock to memory cartridge and wait for PLL to lock. |
| 12 | HC | | | Load counter with Clock Enable Delay register value and begin count (HC, f0, E8). |
| 13 | HC | | | Wait for count to expire. |
| 14 | HC | | $t_{DC}$ | Signal to DC to execute power-up sequence. |
| 15 | DC | | | Tristate MNET inputs. |
| 16 | HC | | $t_{HC}$ | Tristate MNET inputs (if driving 0's when bus is disabled). |
| 17 | HC | | | Drive RESET inactive to hot-plugged memory cartridge. |
| 18 | HC | | $t_{SYNC}$ | Synchronize the MNET bus interface between HC, DC, and MC for the hot-plugged cartridge. |
| 19 | HC | | | Generates an interrupt indicating that the power-on sequence is complete (HC, f0, D3, bit4–0). |
| 20 | | SW | | Clear the Auto Power Up status register (HC, f0, D3, bit4–0). |
| 20 | | SW | | Program I2C configuration registers (MC, f0, E8). |

TABLE 6-continued

Hot-plug Power-up Sequence

| | | | |
|---|---|---|---|
| 20 | SW | | Program MC 12C configuration registers to execute reads of DIMM SPD register space (MC, f0, E0, E4, F0, F4). |
| 21 | MC | $t_{SPD}$ | MC executes 12C reads of up to 64-bits per programmed read and generates an interrupt (MC, f0, D8, bit4–0). |
| 21 | SW | | Write to clear IIC status (MC, f0, D8, bit4–0). |
| 22 | SW | | Verify DIMM compatibility of the hot-plugged memory cartridge with the other memory cartridges. If DIMM compatibility fails, see DIMM Incompatibility section. |
| 23 | SW | | If initiating a hot-upgrade sequence, program all MC's to be in non-pipelined mode (MC, f0, C8, bit1). |
| 24 | SW | | Program MC configuration space on the hot-plugged memory cartridge. |
| 25 | SW | | Update CAS latency in other MC's if necessary. If CAS latency is changed, must set the Hot-reset MRS configuration bit so that an MRS will be executed on the MNET RESYNC (MC, f0, C8, bit12). |
| 26 | SW | | Update memory controller timing attributes in other MC's if necessary. Changes to memory controller attributes will not be seen by internal logic until HC generates an MNET RESYNC command (MC, f0, CC, D0). |
| 27 | SW | | Write to MC Initialize Memory configuration register (MC, f0, C8, bit9). |
| 28 | MC | $t_{INITMEM}$ | Memory controller executes a precharge. |
| 29 | MC | | Memory controller executes a Mode Register Set cycle. |
| 30 | MC | | Memory controller executes 8 refresh transactions. |
| 31 | SW | | Set the HC Flush and Resync configuration register (HC, f0, 90, bit4). |
| 32 | HC | $t_{FLUSH}$ | Flushes all of the outstanding memory cycles to the MC's. |
| 33 | HC | | Generates an MNET RESYNC command to resynchronize all of the MC's. |
| 34 | MC-all | | Updates Memory Controller Attribute registers with shadow register program values, resets queue pointers and state machines, disables and re-enables the refresh counters to sync refresh, enables memory transactions, executes MRS if enabled. |
| 35 | SW | | Clear the HC Flush and Resync configuration register (HC, f0, 90, bit4). |
| 36 | SW | | Execute the Rebuild procedure (HC, f0, 90, bit0). |
| 36 | HC | $t_{REBUILD}$ | Execute Rebuild procedure and generate an interrupt (HC, f0, 92, bit0). |
| 37 | SW | | Enable data ECC and XOR compare logic in DC, auto-replace still enabled. |
| 38 | SW | | Place DC in Verify mode (DC, f0, 62, bit1). |
| 39 | SW | | Execute the Verify procedure (HC, f0, 90, bit2). See Verify Procedure section for details on handling errors during the Verify procedure. |
| 39 | HC | $t_{VERIFY}$ | Execute Verify procedure and generate an interrupt (HC, f0, 92, bit0). |
| 40 | SW | | Turn off XOR engine auto-replace, system fully redundant (DC, f0, 62, bit1). |
| 41 | SW | | Write to HC to turn Power LED to "on" state on the added memory cartridge (HC, f0, 94-9C, bit6–5). |
| 42 | SW | | Write to HC to set the Fault LED to the "off" state for the powered up memory cartridge if previously indicating a fault condition (HC, f0, 94-9C, bit8–7). |
| 43 | | | If a full set of additional memory added (hot-add, hot-upgrade): Execute Initialize procedure across new memory. Execute Verify procedure across new memory. |
| 44 | | | |

Δt Timing parameters:

| Parameter | Value | Description |
|---|---|---|
| $t_{SCANIN}$ | 200 usec. | time required to bring input in through the scan chain, this does not account for debounce time |
| $t_{SCANOUT}$ | 200 usec. | time required to drive an output through the scan chain |
| $t_{PU}$ | | time required to enable power to the cartridge |
| $t_{PLL}$ | 10 usec. | time required to lock PLL |
| $t_{DC}$ | 100 nsec. | time required for DC to complete sequence |
| $t_{HC}$ | 100 nsec. | time required for HC to complete sequence |
| $t_{SYNC}$ | 2 usec. | time required to execute MNET resynchronization process |
| $t_{SPD}$ | 1.2 msec. | time required to do a single SPD access, assumes IIC interface operating at 80 kHz |
| $t_{INITMEM}$ | 1 usec. | time required for MC to complete initialization process |
| $t_{FLUSH}$ | 3 usec. | time required to complete memory cycle flush and MC resynchronization |
| $t_{REBUILD}$ | 5 min. | time required to complete memory rebuild |
| $t_{VERIFY}$ | 5 min. | time required to complete memory verify |
| | 0 | no additional time - indicates that this step is included in the previous ∈t value |

Notes:
(1) Assumes 100 MHz core clock frequency.
(2) All values are approximations to be used as guidelines for software.

Note:
All interrupts and polled registers referred to in this table can be programmed to be INTR, SMI, NMI, or poll.
Table recommends most likely programming for each condition.

Table 7 below illustrates one hot-plug power-down sequence which may be implemented in the present system 10. Initially, all memory cartridges 25A–25E are online and operating in a fully redundant state 100, as previously described herein. Only the memory cartridge to be powered-down may be in the fault state 102 or rebuild state 106.

TABLE 7

Hot-plug Power-down Sequence

| | HW | SW | Δt | Description |
|---|---|---|---|---|
| 1 | HC | | $t_{SCANIN}$ | Detect the transition of the PIRN signal indicating that the operator is ready to power-down the memory module (HC, f0, A4-AC, bit0). |
| 2 | HC | | | Generate an interrupt. |
| 3 | | SW | | Clear PIRN status (HC, f0, A4-AC, bit0). |
| 3 | | SW | | Verify that the system is in a redundant configuration (DC, f0, ????, ????) and that only the memory cartridge generating the PIRN interrupt may be in the attention or rebuild state. If the selected memory cartridge cannot be legally powered down, ignore the request and inform the operator that the cartridge cannot be removed by sounding the audible alarm. (HC, f0, ????, ????). If the operator proceeds to remove the cartridge in an illegal, see the Illegal Memory Cartridge Removal section. |
| 4 | | SW | $t_{WAIT}$ | <Optional> Write to the HC to set the Power LED to the "flash" state on the selected cartridge to allow the operator to abort the power-down sequence for approximately 5 seconds. If an interrupt is generated off the PIRN signal, the power-down operation is aborted and the state of the system is unchanged. If not, set the Power LED to the "off" state. (HC, f0, 94-9C, bit6–5). |
| 5 | | SW | | Write to selected MC Interrupt Enable registers to disable interrupts (MC, f0, D9-DB). |
| 6 | | SW | | Write to HC Auto Power Down configuration register for the selected cartridge (HC, f0, D0, bit4–0) |
| 7 | HC | | $t_{DC}$ | Signal DC to execute power-down squence. |
| 8 | DC | | | Disable DC data ECC on the selected memory segment, disable XOR compare, and enable XOR engine auto-replace. |
| 9 | HC | | $t_{HC}$ | Drive RESET to the selected memory cartridge so that the MC on the memory cartridge will tristate its MNET and SDRAM signals. |
| 10 | HC | | | Drive 0's or tristate all MNET interface signals to the selected memory cartridge. |
| 11 | HC | | $t_{DC}$ | Signal to DC to execute power-down sequence. |
| 12 | DC | | | DC drive 0's or tristate all MNET interface signals to the selected memory cartridge. |
| 13 | HC | | $t_{CLK} + t_{SCANOUT}$ | Disable the clock to the selected memory cartridge. |
| 14 | HC | | $t_{PD} + t_{SCANOUT}$ | Deasserts a signal to an external device to disable power to the memory cartridge. |
| 15 | HC | | | Load counter with Safe Power Down Delay register value and begin count. |
| 16 | HC | | | Wait for count to expire. |
| 17 | HC | | | Generate an interrupt indicating the completion of the power down sequence (HC, f0, D1, bit4–0). |
| 18 | | SW | | Clear the Power Down status (HC, f0, D1, bit4–0). |

Δt Timing parameters:

| Parameter | Value | Description |
|---|---|---|
| $t_{SCANIN}$ | 200 usec. | time required to bring input in through the scan chain, this does not account for debounce time |
| $t_{WAIT}$ | 5 sec. | time allowed for operator to abort operation |
| $t_{DC}$ | 100 nsec. | time required for DC to complete sequence |
| $t_{HC}$ | 100 nsec. | time required for HC to complete sequence |
| $t_{CLK}$ | | time required to disable external clock, uses scan out chain |
| $t_{PD}$ | | time required to power up cartridge, uses scan out chain |
| | 0 | no time - indicates that this step is included in the previous ∈t value |

Notes:
(1) Assumes 100 MHz core clock frequency.
(2) All values are approximations to be used as guidelines for software.
Note:
All interrupts and polled registers referred to in this table can be programmed to be INTR, SMI, NMI, or poll.
Table recommends most likely programming for each condition.
Note:
The auto power-down sequence can be bypassed, all of the steps within the auto power-down sequence would then need to be controlled by software.
Note:
All of the serial shift-out and serial shift-in operations take 4 us.

Table 8 below illustrates an auto hardware power-down sequence which may be implemented in the present system 10. This event is implemented when a user has unlocked the memory cartridge illegally. Despite the fact that software has determined that performing a hot-plug operation on this memory cartridge is an illegal operation and the audible alarm has been enabled, the user continues to remove the memory cartridge. This event will result in a disconnect of the IRSS_ and then the IRSL_pins. In the sequence described in Table 8, it is possible that the time required to detect IRSS_ and execute the auto power-down sequence may exceed the time between the disconnect of the IRSS_ and IRSL_. In this instance, the external logic powers-down the memory cartridge and may result in signals being driven into the memory controller 20A–20E after it has been powered down, which may be undesirable. The sequence will terminate in a NMI.

condition, the host/data controller 16,18 will indicate which DIMM is faulty. Once a user is notified of the failure, a normal hot-plug procedure described with reference to Table 7 is initiated on the memory cartridge 25A–25E containing the faulty DIMM. The system is taken out of a redundant mode of operation, and the individual memory cartridge is powered-down. The user then replaces the faulty DIMM and inserts the memory cartridge back into the system. The memory cartridge is then powered-up in accordance with the procedure described with reference to Table 6. Once the memory cartridge is powered up, it is rebuilt and verified for functionality. If the memory cartridge has no faults, the system is returned to a redundant mode of operation.

Hot-add and hot-upgrade procedures may also be implemented using the techniques described above. A hot-add procedure is the ability to add one or more banks of DIMMs in empty DIMM sockets to a system that is currently

TABLE 8

Auto Hardware Power-down Sequence

| | HW | SW | Δt | Description |
|---|---|---|---|---|
| 1 | Ext. Logic | | | IRS-short pin disconnects at memory cartridge connector. |
| 2 | HC | | $t_{SCANIN}$ | Detect the transition of the IRS-short signal indicating the emminent removal of the corresponding memory module. IRS-short is a serial shift input, no glitch filtering. |
| 3 | HC | | $t_{AUTOPD}$ | Executes the auto power-down sequence; see "Table 4 Hot-plug Power-down Sequence" above. |
| 4 | HC | | | Generate an interrupt (NMI) indicating the completion of the power down sequence (HC, f0, D1, bit4–0). |
| 4 | Ext. Logic | | | IRS-long pin disconnects at the memory cartridge connector |
| 5 | Ext. Logic | | | The power controller senses the voltage level on the output side of the FETs. When the voltage reaches ~2.95 V, the power controller will deassert the PWRFAULT_signal. The M3PAL detects the PWRFAULT_signal deassertion and asserts the CLKEN_signal. The CLKEN_signal will enable the quick switch to connect the system clock to the cartridge. |
| 6 | Ext. Logic | | | The M3PAL detects the IRS-long pin disconnect on the connector. The PAL will deassert the PWRON_signal to the power controller. When the power controllers sees the PWRON_signal deasserted, it will turn the external-FETs off to remove power to the cartridge. |

Δt Timing parameters:

| Parameter | Value | Description |
|---|---|---|
| $t_{SCANIN}$ | 200 usec. | time required to bring input in through the scan chain, this does not account for debounce time |
| $t_{AUTOPD}$ | 5 sec. | time required to complete auto power-down sequence |
| | 0 | no time - indicates that this step is included in the previous ∈t value |

Note:
All interrupts and polled registers referred to in this table can be programmed to be INTR, SMI, NMI, or poll.
Table recommends most likely programming for each condition.

The hot-plug events associated with the present system allow a user to remove a memory cartridge 25A–25E while the system remains operational. It may be desirable to be able to replace individual memory modules (DIMMs) while the system is still operational. Such a "hot-replace" feature provides the ability in a fault-tolerant memory configuration to disable redundancy, replace a failed DIMM with an equivalent DIMM, and then re-establish redundancy without significantly impacting normal system operation and without requiring the system to be powered down. Hot-replace is generally associated with a failure condition or a pre-failure condition. A failure condition will result in a light associated with one of the DS LEDs 144 being illuminated indicating which corresponding DIMM has failed. For a pre-failure operational to increase the memory capacity using the hot-plug procedures described above. A hot-upgrade procedure is the ability to replace an existing bank of DIMMs currently operational within the system with larger capacity DIMMs using the hot-plug procedures described above.

In a hot-add procedure, equivalent DIMMs are added in the same empty DIMM slot across all five memory cartridges before the additional memory capacity can be utilized. Any supported DIMM may be added independent of the current memory configuration. Further, no system degradation occurs during the hot-add procedure except for the transaction overhead associated with the rebuild procedure is typically executed on each hot-plug event. Once all five DIMMs are added, an initialize procedure will write a known value to all of the new memory locations. This procedure may have a 25% overhead and a duration of approximately 30 sec/Gbyte.

The hot-add procedure may be implemented if there is an empty slot on the memory cartridge 25A–25E and if software support exists. To implement the hot-add procedure, the user performs a normal hot-plug procedure on each of the memory cartridges 25A–25E and adds the same size DIMM to the same empty slot across all memory cartridges 25A–25E. If more than one DIMM per cartridge 25A–25E is added, the DIMMs added to the same memory cartridge 25A–25E do not need to be the same. However, if the current memory is striped, and memory striping is to be maintained on the new memory, the new memory is typically added in identical pairs across the two memory controller channels. Adhering to the striping rules will facilitate a hot-upgrade in the future. Next, the system rebuilds and verifies the current memory as each of the memory cartridges 25A–25E is hot-plugged into the system. Additional memory capacity may not be available until each of the memory cartridges 25A–25E is upgraded. Once all of the new memory (DIMMs) is added, it is initialized to a known value. This procedure may be initiated automatically or through a user interface. Once the additional memory is initialized, the operating system is informed that the additional memory is available.

The hot-upgrade procedure can potentially introduce a large number of memory configurations. Each memory configuration that is supported is tested. To reduce the number of configurations that are validated, certain limitations may be placed on legal hot-upgrade options, as set forth by way of example. First, the initial memory configuration may pair similar DIMMs in the two channels 67,69 of each memory cartridge 25A–25E. Each channel may have two dissimilar DIMMs within the channel as long as the other channel mirrors those DIMMs. Second, DIMM upgrades may be done in pairs of similar DIMMS. The user may upgrade two or four DIMMs per memory cartridge 25A–25E at a time. Third, all of the memory may be completely striped.

The hot-upgrade procedure does not place additional constraints on the system, beyond those discussed with reference to the hot-add procedure. A user can add any supported DIMM into any unoccupied slot in the memory cartridge 25A–25E. However, to ensure that hot-upgrade to the system will be possible in the future, the user should follow the hot-add requirements, along with the limitations set forth above.

To implement the hot-upgrade procedure, the user first verifies that the system is in a state that allows hot-upgrade. The user then determines the current memory configuration by part-number and DIMM-slot. Next, the user implements a normal hot-plug procedure, as described above, on the first memory cartridge to replace the smaller DIMM with the larger DIMM. The system will rebuild and verify the contiguous portion of the new DIMM. Next, the memory is brought online and the entire memory subsystem begins to operate in the redundant state using the new DIMM, until the system again enters the non-redundant state to upgrade the next memory cartridge. It should be understood that the additional memory capacity may not be available until all memory cartridges 25A–25E have been upgraded. Once the final memory cartridge 25A–25E is upgraded, the additional memory is initialized and the operating system is informed that additional memory is available so that the memory subsystem may return to normal operation.

The memory array 26 normally operates in a pipelined mode in which multiple transactions may take place of the bus 22 at any given time. However, during an upgrade procedure, there may be differences between the new DIMMs and the existing DIMMs, such as timing and latency differences. Therefore, when the first DIMM is upgraded, the memory array 26 transitions from the pipelined mode into a non-pipelined mode in which only one transaction may take place on the bus at any given time. This transition essentially slows operation of the memory array 26 so that any timing differences between the DIMMs may be handled without creating data errors. Once all of the DIMMs have been replaced, rebuilt, and verified, the memory array 26 will transition back into the faster pipelined mode of operation. It should also be noted that the non-pipelined state may be entered in order to conserve power. In this context, the transition may take place at user selection or based upon a signal from an appropriate system, such as a thermal indication from a power supply.

The system 10 is also designed to adapt to various memory technologies. For example, several DRAM technologies are available (or will be available soon) in addition to SDRAM and EDO/FPM. These newer memory devices include: SDRAM2 or Double Data Rate SDRAM, Direct-Rambus, and SyncLink DRAM. To mitigate the risks of: (1) having to redesign the host and data controllers to support different memory types, (2) being limited to only a certain type of memory, and (3) choosing the wrong type of memory, a high-performance memory interface, the aforementioned MNET bus 22, is used to decouple the host and data controllers from interfacing directly to the memory segments 24, as previously discussed with reference to FIGS. 1–3. The MNET bus 22 is a point-to-point, general-purpose memory bus. As also previously mentioned, each MNET bus segment 22A–22E is coupled to an individual memory controller 20A–20E associated with each of the respective memory segments 24A–24E. Therefore, if a different memory type is to be used, a memory segment 24 of the chosen memory type with an appropriate memory controller 20 (in the form of a memory cartridge 25, for example) may be substituted for the existing memory segment and memory controller since the bus 22 will communicate with each type.

Another interesting aspect of the system 10 is its ability to "interleave" data on the different channels 67A–67E and 69A–69E of the memory segments 24A–24E. In this context, "interleaving" refers to writing odd cachelines on the first channels 67A–67E and writing even cachelines on the second channels 69A–69E. As mentioned previously during the discussion of the exemplary memory controller illustrated in FIG. 3, the memory segments 24A–24E may be organized on a single channel or on 2N channels, where N is an integer, and in this particular embodiment, each of the memory segments 24A–24E is divided into two channels 67A–67E and 69A–69E. Since channel 67A–67E and 69A–69E in this embodiment is capable of containing up to four DIMMs, a system may be constructed in which the memory devices in one channel 67 are not identical to the memory devices in the other channel 69. Although each memory segment 24A–24E will typically be identical to simplify timing and latency concerns, as well as to facilitate the striping of data across the multiple memory segments 24A–24E as described above, interleaving allows each channel to contain different amounts of memory.

Figure 7:
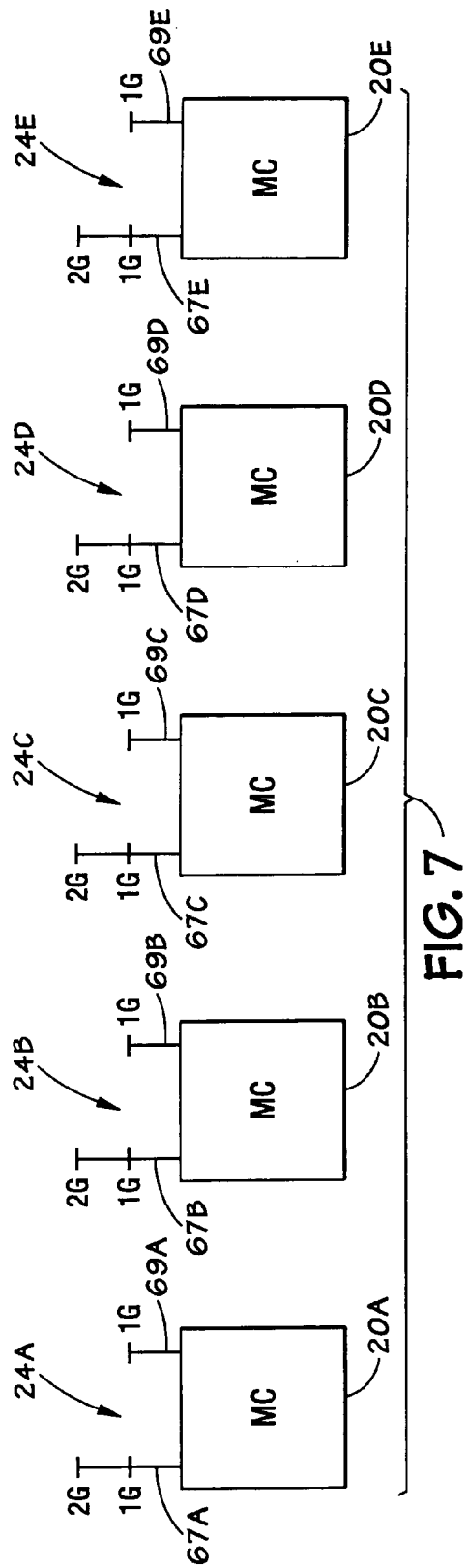
FIGS. 7 and 8 illustrate diagrammatic views of variously-sized channels of memory segments in accordance with the present invention.

By way of example, FIG. 7 illustrates the five memory segments 24A–24E in a configuration in which each of the first channels 67A–67E accesses a 1 GB DIMM and a 2 GB DIMM and each of the second channels 69A–69E accesses a 1 GB DIMM. Because the fifth memory segment 24E is used to store parity information in this running example, the available memory capacity for storing data resides on the first four memory segments 24A–24D and, thus, equals 16 GB. Of this 16 GB of memory, the addressable space available on both the first channels 67A–67D and the second channels 69A–69D equals 8 GB due to the presence of the 1 GB DIMMs on each of the channels 67A–67D and 69A–69D. Accordingly, the addressable space available past the space that is available on both channels equals 8 GB due to the presence of the 2 GB DIMMs on each of the first channels 67A–67D. Thus, the address space is mapped such that the space from 0 to 8 GB may be interleaved on both channels 67A–67D and 69A–69D, while the space from 8 GB to 16 GB will not be interleaved since it resides only on the first channels 67A–67D.

Given this exemplary construction, from 0 to 8 GB, odd cachelines are written on the first channels 67A–67D and even cachelines are written on the second channels 69A–69D. From 8 GB to 16 GB, all cachelines are written on the first channels 67A–67D. Thus, the memory array 26 in this example will contain an interleaved region from 0 to 8 GB and a non-interleaved region from 8 GB to 16 GB.

Of course, it should-be understood that this discussion has focused on the address space defined by the first four memory segments 24A–24D. However, the discussion applies equally to the manner in which parity information is written to the fifth memory segment 24E. In other words, from 0 to 8 GB, odd cachelines of parity information are written on the first channel 67E and even cachelines of parity information are written on the second channel 69E, and from 8 GB to 16 GB, all cachelines of parity information are written on the first channel 67E.

Figure 8:
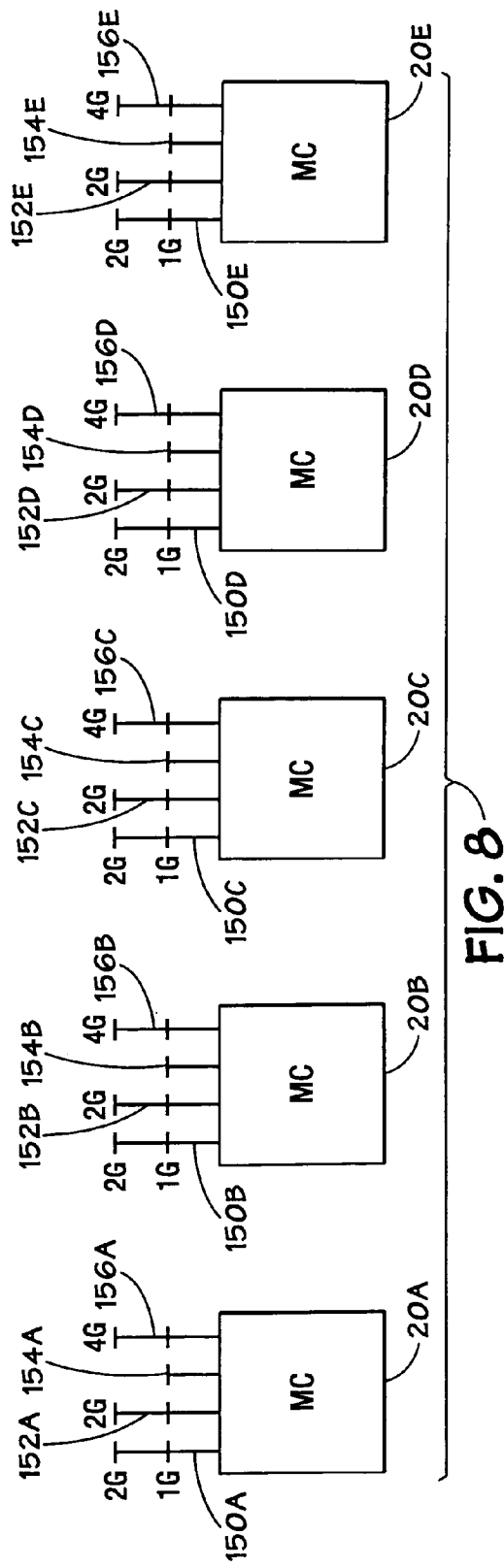

It should be appreciated that additional channels would be interleaved in a similar fashion. In other words, if each memory segment 24A–24E included four channels instead of the two channels discussed by way of example above, memory devices present on each of the four channels would define an initial address space that would define an initial interleaved region. However, unlike the example discussed above, a secondary interleaved region may be defined by memory devices present on a selected two of the four channels. One such example is illustrated in FIG. 8.

In this example, each of the memory segments 24A–24E includes four channels 150A–150E, 152A–152E, 154A–154E, and 156A–156E. Each channel accesses a 1 GB DIMM, each of the first and second channels 150A–150E and 152A–152E accesses an additional 2 GB DIMM, and each of the fourth channels accesses an additional 4 GB DIMM. Thus, in this example, the initial interleaved region extends from 0 to 16 GB, since it is defined by the four 1 GB DIMMs on each of the channels of the first four memory segments 24A–24E. The secondary interleaved region extends from 16 GB to 32 GB, since it is defined by the two 2 GB DIMMs on each of the first two channels 150 and 152 of the first four memory segments 24A–24E. Finally, the non-interleaved region extends from 32 GB to 48 GB, since it is defined by the single 4 GB DIMMs on each of the fourth channels 156 of the first four memory segments 24A–24E.

Although the presence of similar memory devices across 2N channels does not require interleaving, it should be appreciated that interleaving does provide certain advantages. For instance, interleaving increases the bandwidth of the memory system since it permits two or more memory accesses to occur simultaneously. This capability is particularly advantageous in applications involving sequential addressing.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A computer system comprising:
   a plurality of memory segments, each of the plurality of memory segments having a first channel coupled to one or more first memory devices comprising a first memory capacity and a second channel coupled to one or more second memory devices comprising a second memory capacity different than the first memory capacity;
   a memory controlling system coupled to each of the plurality of memory segments via a respective bus segment, the memory controlling system being adapted to simultaneously write data on each of the first channel of each of the plurality of memory segments in response to a first command and the second channels of each of the plurality of memory segments in response to a second command; and
   a host/data controller coupled to the memory controlling system, the host/data controller determining the memory capacity coupled to each of the first and second channels of the respective plurality of memory segments, selecting a smallest memory capacity common to each of the first and second channels of the plurality of memory segments, and designating the smallest common memory capacity as an interleaving region on each of the one or more first and second memory devices for each of the plurality of memory segments, wherein the interleaving region on each of the one or more first and second memory devices may be accessed simultaneously.

2. The system, as set forth in claim 1, wherein each of the respective first and second channels is adapted to contain at least one dual inline memory module.

3. The system, as set forth in claim 2, wherein each of the respective first and second channels is adapted to contain up to four dual inline memory modules.

4. The system, as set forth in claim 1, wherein the memory controlling system comprises a plurality of memory controllers, wherein a respective one of the plurality of memory controllers is coupled to a respective one of the plurality of memory segments via one of the respective bus segments.

5. The system, as set forth in claim 1, wherein, after designating the interleaving region, the host/data controller designates any memory capacity remaining on one of the first and second channels of each of the plurality of memory segments as a non-interleaving region.

6. The system, as set forth in claim 1, wherein the plurality of memory segments comprise five memory modules and wherein the memory controlling system comprises five memory controllers, wherein a respective one of the five memory controllers is coupled to a respective one of the five of memory segments via one of the respective bus segments.

7. A computer system comprising:
   a plurality of memory segments, each of the plurality of memory segments having a first channel coupled to one or more first memory devices comprising a first memory capacity and a second channel coupled to one or more second memory devices comprising a second memory capacity different than the first memory capacity;
a memory controlling system coupled to each of the plurality of memory segments via a respective bus segment, the memory controlling system being adapted to simultaneously write data on each of the first channel of each of the plurality of memory segments in response to a first command and the second channel of each of the plurality of memory segments in response to a second command; and
a host/data controller coupled to the memory controlling system, the host/data controller striping data across the plurality of memory segments, and the host/data controller determining the memory capacity coupled to each of the first and second channels of the respective plurality of memory segments, selecting a smallest memory capacity common to each of the first and second channels of the plurality of memory segments, and designating the smallest common memory capacity as an interleaving region on each of the one or more first and second memory devices for each of the plurality of memory segments, wherein the interleaving region on each of the one or more first and second memory devices may be accessed simultaneously.

8. The system, as set forth in claim 7, wherein each of the respective first and second channels is adapted to contain at least one dual inline memory module.

9. The system, as set forth in claim 8, wherein each of the respective first and second channels is adapted to contain up to four dual inline memory modules.

10. The system, as set forth in claim 7, wherein the memory controlling system comprises a plurality of memory controllers, wherein a respective one of the plurality of memory controllers is coupled to a respective one of the plurality of memory segments via one of the respective bus segments.

11. The system, as set forth in claim 7, wherein, after designating the interleaving region, the host/data controller designates any memory capacity remaining on one of the first and second channels of each of the plurality of memory segments as a non-interleaving region.

12. The system, as set forth in claim 7, wherein the plurality of memory segments comprise five memory modules and wherein the memory controlling system comprises five memory controllers, wherein a respective one of the five memory controllers is coupled to a respective one of the five of memory segments via one of the respective bus segments.

* * * * *

UNITED STATES PATENT AND TRADEMARK OFFICE
CERTIFICATE OF CORRECTION

| | | |
|---|---|---|
| PATENT NO. | : 7,010,652 B2 | Page 1 of 1 |
| APPLICATION NO. | : 10/928046 | |
| DATED | : March 7, 2006 | |
| INVENTOR(S) | : Gary J. Piccirillo et al. | |

It is certified that error appears in the above-identified patent and that said Letters Patent is hereby corrected as shown below:

In column 8, line 2, after "corrects" delete "20".

In column 30, line 27, in Claim 1, delete "channels" and insert -- channel --, therefor.

Signed and Sealed this

Fourteenth Day of April, 2009

JOHN DOLL
*Acting Director of the United States Patent and Trademark Office*